(12) United States Patent
Deleu

(10) Patent No.: US 12,058,821 B2
(45) Date of Patent: Aug. 6, 2024

(54) MODULAR CONSTRUCTION WITH LED SCREEN

(71) Applicant: Aluvision N.V., Deinze (BE)

(72) Inventor: Dirk Deleu, Deinze (BE)

(73) Assignee: Aluvision N.V., Deinze (BE)

( * ) Notice: Subject to any disclaimer, the term of this patent is extended or adjusted under 35 U.S.C. 154(b) by 213 days.

(21) Appl. No.: 17/641,314

(22) PCT Filed: Sep. 8, 2020

(86) PCT No.: PCT/IB2020/058320
§ 371 (c)(1),
(2) Date: Mar. 8, 2022

(87) PCT Pub. No.: WO2021/048728
PCT Pub. Date: Mar. 18, 2021

(65) Prior Publication Data
US 2022/0346242 A1 Oct. 27, 2022

(30) Foreign Application Priority Data
Sep. 9, 2019 (BE) .................................. 2019/5594

(51) Int. Cl.
*H05K 5/00* (2006.01)
*G09F 9/302* (2006.01)
*G09F 9/33* (2006.01)

(52) U.S. Cl.
CPC ......... *H05K 5/0021* (2013.01); *G09F 9/3023* (2013.01); *G09F 9/33* (2013.01); *H05K 5/0018* (2022.08)

(58) Field of Classification Search
CPC .... H05K 5/00189; H05K 5/0021; G09F 9/33; G09F 9/3023
USPC ........................................................ 361/730
See application file for complete search history.

(56) References Cited

U.S. PATENT DOCUMENTS

2016/0234959 A1* 8/2016 Kuang ................. G09F 9/3026
2018/0039472 A1 2/2018 Kreiner

FOREIGN PATENT DOCUMENTS

| CN | 201780736 | * | 3/2011 | .............. G09F 9/33 |
| CN | 103065558 | * | 4/2013 | .............. H05K 5/02 |
| CN | 102332230 | * | 6/2013 | .............. H05K 5/00 |
| CN | 204221346 | * | 3/2015 | .............. G09F 9/33 |
| CN | 204390649 | * | 6/2015 | .............. G09F 9/33 |
| KR | 20070097689 | | 10/2007 | |
| WO | 2016054958 | | 4/2016 | |

* cited by examiner

*Primary Examiner* — Hung S. Bui
(74) *Attorney, Agent, or Firm* — Marcus C. Dawes

(57) ABSTRACT

Set of at least one corner element and at least one tile element, connectable to each other so as to construct a modular construction, wherein at least one tile element is provided with an LED screen which extends over substantially a whole tile surface, wherein the tile surface forms a visible side of the tile element in the modular construction, and wherein at least one corner element is provided with an LED screen which extends over a corner surface which, in connected state, is adjacent to said tile surface.

12 Claims, 6 Drawing Sheets

MODULAR CONSTRUCTION WITH LED SCREEN

The invention relates to a set of a corner element and a tile element which can be connected to each other in order to construct a modular construction.

The invention relates particularly to sets for constructing modular constructions for exhibition booths, advertising constructions, structures used in the entertainment industry, for instance stages, and the like. Such modular constructions are preferably designed such that they can be constructed and dismantled in rapid and simple manner, can be transported compactly, and are light. It is further advantageous for the set of components to allow different shapes and sizes of construction to be built. The modularity implies a complementarity, extendibility and interchangeability of the components in the construction. In other words, the modular construction implies that a varying and large number of shapes and dimensions of construction can be realized with a limited number of unique components. The invention particularly relates to a set of components in which LEDs are integrated.

Corner elements and tile elements, among other things, are used in the construction of modular booths. Tile elements are coupled to each other so as to form a surface. The corner element is typically formed by a profile and is provided as connecting piece between a plurality of surfaces. The corner element can connect surfaces to each other at an angle. It will be apparent that this angle can also be 180°, so that the corner element connects two surfaces in line with each other. This can be useful when the width or height of the surface were to become too great to be formed in one piece.

The maximum width of the tile element, and the details of the corner element, depend on the manufacturer. The principles of construction on the basis of corner elements and tile elements are however almost always applied. When LED screens are integrated in an exhibition booth, this is typically done at the position of a surface. One or more tile elements are for this purpose provided at the position of a visible surface with an LED module. This LED module typically extends to the peripheral edges of the visible surface of the LED tile. This allows a plurality of LED tiles to be placed adjacently of each other, this creating the impression that the LED screen runs continuously from the one to the other LED tile. In other words, it creates the illusion that one large LED screen is provided in the wall. This LED screen is however constructed from a plurality of individual LED modules which are provided on the modular tiles which together give an integrated impression.

There is a commercial demand to integrate LED screens in a modular construction in more flexible manner. The commercial demand is more specifically to create the LED screen not in a single surface but over a plurality of surfaces, wherein the plurality of surfaces even lie at an angle, even relative to each other. In other words, the demand is, among other things, for an LED screen which extends over a corner of a construction, wherein the impression is created of one continuously running screen which extends over the corner of the modular construction.

An LED tile with at least one chamfered side was developed. Two such tiles can be placed with their chamfered sides against each other, such that an angle is formed between the LED tiles. This solution allows an LED screen to continue over a corner of a modular construction. The skilled person will appreciate that one LED tile with chamfered side can be integrated in an LED surface consisting of a plurality of tiles which together form an LED screen in that surface, and the other LED tile with chamfered edge is integrated in another surface, in which a further LED screen is integrated in similar manner. Because the tiles with chamfered corners are mutually connected at the position of their corner, the LED screen will roughly continue over the corner.

The above described solution has several drawbacks. A first drawback relates to the connecting line between the two LED tiles. An LED tile is a tile element on which an LED module is provided. The LED module is constructed with a PCB on which the LEDs are provided. In practice the thickness of the PCB does not allow the LED tile to be chamfered down to the surface where the LEDs are situated. In order to generate a continuous visual impression the intermediate distance between LEDs situated on an LED tile must be equal to the intermediate distance between LEDs on the edge of one tile on one side and the LEDs on the adjacent edge of an adjacent tile on the other. When the tiles are coupled to each other in the same plane, this distance can be substantially respected since LEDs can be placed up to the outermost peripheral edge of the PCB. Due to the thickness of the PCB, it is not possible in a corner to place the LEDs of one chamfered tile element close enough to the LEDs of another chamfered tile element. The PCBs of tile elements will collide. A visual interruption is hereby visible at the position of the corner. This interruption is undesirable.

A second drawback is more fundamental, and relates more to the modularity of the construction. Because LED tile elements are chamfered in order to form a corner, other tile elements, non-LED tile elements, will also have to be chamfered in order to form a corresponding corner. Only a portion, for instance a strip of the wall, is usually provided with LEDs. The remaining portion of the wall is provided in traditional manner with panels or cloths or another finish. A combination of LED elements and conventional elements will therefore be used in practice to construct a modular construction. When an LED screen extends over an angle in only a portion of a wall of a modular construction, chamfered tile elements will also have to be provided adjacently of the chamfered LED tiles. This limits the modularity of the components. More specifically, a larger number of different components will be necessary in order to construct such a modular construction. On the other hand, the freedom of design is limited, particularly when the availability of determined components must be taken into consideration.

It is an object of the invention to provide a set for a modular construction in which LED screens can be integrated in an improved manner.

The invention provides for this purpose a set of at least one corner element and at least one tile element, connectable to each other so as to construct a modular construction, wherein at least one tile element is provided with an LED screen which extends over substantially a whole tile surface, wherein the tile surface forms a visible side of the tile element in the modular construction, and wherein at least one corner element is provided with an LED screen which extends over a corner surface which, in connected state, is adjacent to said tile surface.

Because both a tile element and a corner element are provided with an LED screen, the modularity of the construction is improved considerably. This is because the LED screen which extends over a corner can be constructed according to traditional principles, with tile elements forming a flat wall on the one hand, and corner elements forming a corner. This considerably reduces the number of different components necessary for constructing a construction and increases the freedom for a designer to integrate an LED screen in a construction. More specifically, a modular construction can be constructed in traditional manner with panels, profiles, tile elements and corner elements, also when an LED screen is integrated and extends over a corner of the construction.

A further advantage relates to the uniformity of the LED screen at the position of the corner. Providing a corner element with an LED screen which extends over a corner surface gives the manufacturer the option of giving the LED screen a form which is uninterrupted and runs continuously over the corner. This is because the LED corner is not formed by connecting two substantially flat elements to each other at an angle, but is formed by a corner surface which extends over a corner element. It is thus not necessary to optimize a connection between two chamfered LED tiles in order to make the distance between adjacent LEDs as small as possible, as it is in the prior art. It is possible to optimize and to design a corner surface such that the LED screen extends continuously over the corner. Many solutions can be envisaged and used for this purpose. This is because the corner element is typically supplied as a substantially static component. Providing the corner element with an LED screen enables non-chamfered tile elements to be used at the position of the corner element. The set according to the invention therefore allows an LED screen to run over a corner in simple manner in a modular construction.

In connected state the tile surface and the corner surface preferably extend substantially parallel, at least at the position of their border. At the position of the border the LEDs in the one element are preferably placed at a distance relative to the LEDs in the other element, this distance being equal to the intermediate distance between the LEDs in a central zone of each LED screen. This ensures a visually continuous transition. When the surfaces lie parallel at the position of the border, it is easy to optimize the intermediate distance between the LEDs with known techniques. This is because adjacent LED tiles are also placed relative to each other such that their surfaces are parallel to each other at the position of the border. Each LED screen preferably has an LED orientation, and the LED orientation of the tile element is the same as the LED orientation of the corner element in connected state. An LED screen is typically constructed with a plurality of colours of LEDs which are placed in a predetermined pattern relative to each other. Although this pattern is repetitive in practice, it is not necessarily symmetrical. Due to the asymmetry, the LED screen has a viewing direction. This means that the colours and/or intensity of the screen will differ depending on the viewing direction. By coordinating the LED orientation of adjacent elements with each other the viewing direction, and so the visual impression made by the screen, will be the same from one determined direction. This increases the visual uniformity of the LED screen which extends over the corner.

Each tile element preferably has a chassis in which at least one LED module is placed so as to form the LED screen. The chassis can be identical to or differ from chassis of standard tile elements. The chassis preferably has at least substantially identical dimensions and a substantially identical form to the chassis of a standard tile element. By placing an LED module herein the modularity is increased further.

The chassis can preferably be connected in the modular construction in a plurality of angular positions. By rotating the chassis the LED modules are also rotated. This allows the orientation of the LEDs in the LED tile to be coordinated, when a corner element is provided, with the orientation of the LEDs in the corner element by rotating the chassis. This further increases the modularity. The LED module can alternatively be connected in a plurality of angular positions to the chassis in order to align the LED orientation of the tile element with the LED orientation of the corner element. Being connectable to the chassis in a plurality of angular positions enables the LED module to be rotated relative to the chassis of the tile. This allows the orientation of the LEDs in the LED tile to be coordinated, when a corner element is provided, with the orientation of the LEDs in the corner element by rotating the LED module in the chassis. This further increases the modularity.

The chassis preferably has a plurality of connecting surfaces at the position of the edges of the tile surface so as to be integrated in the modular construction. Each connecting surface more preferably has connecting means which are complementary to the connecting means on an adjacent tile element and on an adjacent corner element, such that each connecting surface can be connected to a corresponding connecting surface of an adjoining tile element or corner element. The connecting surfaces allow the modular construction to be constructed in different ways and in different configurations. The connecting surfaces preferably additionally also allow the LED elements to be connected to conventional elements.

The connecting means preferably comprise first connecting means for connecting a tile element to a corner element and second connecting means for connecting a tile element to a tile element. When tile elements are connected to each other, more space is typically available for realizing the connection. In practice, tile elements have a larger surface area than corner elements. It is hereby advantageous to provide larger connecting means which can be handled more easily. These larger connecting means are preferably formed such that they can be handled without additional tools. In other words, a screwdriver, hammer, pliers or other tool need not be provided in order to use the second connecting means. When a tile element is connected to a corner element, less space is typically available, particularly in the corner element. Smaller connecting means are thereby preferably provided in order to connect the tile element to the corner element. Accessories such as a screwdriver can indeed be used for use of these smaller connecting means.

Each tile element and each corner element further preferably has a control module for controlling the LEDs. The different control modules of the elements are more preferably coupled in the modular construction to a central processor which provides each control module with individual control signals in order to reproduce a predetermined visual representation over multiple individual LED screens in the modular construction. Providing each tile element with a control module increases the modularity. The control modules are controlled by a central processor in order to reproduce a visual representation over the plurality of coupled LED screens. This allows a modular construction in simple manner.

The tile module preferably has one primary visible side, and the corner module preferably has two primary visible sides. The LED screen of the corner module preferably extends over the two primary visible sides. Providing the corner module with an LED screen on two primary visible sides makes it possible to provide two tile elements at the position of the borders of the corner module, wherein each tile element is adjacent to one visible side of the corner element. As discussed above, at the position of the border each tile surface can lie substantially parallel to the corner surface so that a continuous visual transition can be created. The two visible sides can be straight or curved.

The set preferably further comprises a cube element having three primary visible sides, wherein the cube element is provided with an LED screen extending over a cube surface, such that in connected state the LED screen of the cube surface is adjacent to the LED screen of the corner module. The LED screen of the cube surface is preferably operatively connected to the control module of the corner element. On the basis of the above described principles of the corner element and the tile element an LED screen can extend over a corner from one surface to another surface. When the LED screen extends however over a three-dimensional corner, the cube element will be used to form the LED screen at the position of the intersection of the three surfaces. The above described principles can therefore be applied analogously to the cube element, and the skilled person will appreciate that by providing the cube element the above described advantages and effects can be realized in a three-dimensional corner. The physical dimensions of the cube are typically considerably smaller than those of the corner module and the tile module. It is therefore possible that no space is provided in the cube element for providing a control module. The cube element is therefore provided to be controlled by the control module of at least one adjacent corner module.

The invention will now be further described on the basis of exemplary embodiments shown in the drawings.

In the drawings.

The same or similar elements are designated in the drawings with the same reference numerals.

Figure 1A:
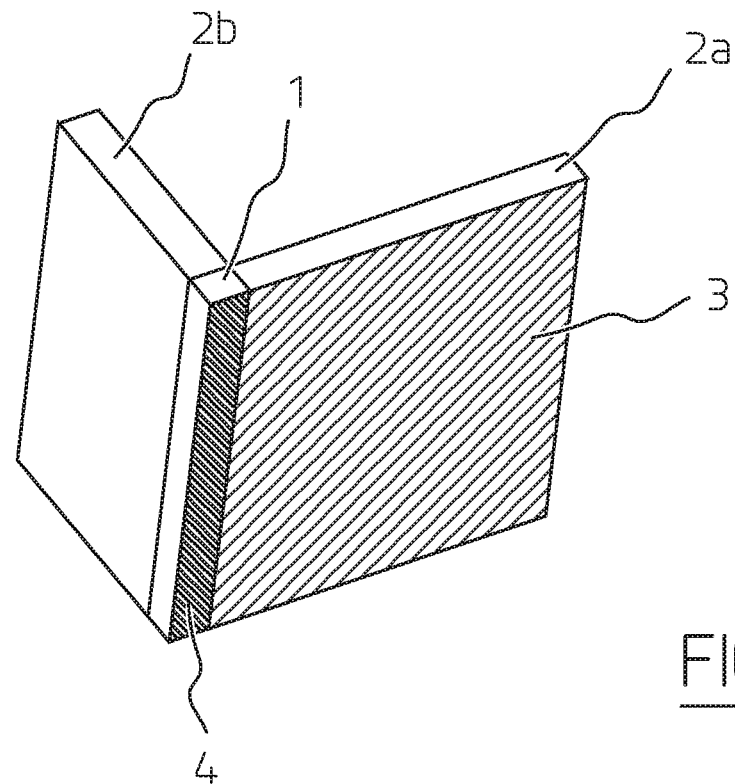
FIG. 1a shows a perspective view of a corner element with two tile elements.

FIG. 1 shows how a corner element 1 can be connected to two tile elements 2a and 2b in a modular construction. In the embodiment of FIG. 1A two tile elements 2a and 2b are connected at an angle of about 90° relative to each other, wherein the corner element 1 forms an intermediate position between the tile elements 2a and 2b. Each tile element has a tile surface 3. Tile surface 3 is defined as the frontal visible surface of tile element 2 when tile element 2 is integrated in a construction. Corner element 1 has a corner surface 4. In FIG. 1A only one part of the corner surface is designated with reference numeral 4. More specifically, the corner surface 4 which is directly adjacent to tile surface 3 is designated. The other corner surface 4 is adjacent to tile element 2b. Corner surface 4 is defined as the visible surface of corner element 1 when corner element 1 is built into a modular construction. In the embodiment of FIG. 1A, where corner element 1 connects tile elements 2a and 2b to each other at an angle of 90°, and wherein corner element 1 has a rectangular cross-section, corner element 1 has a corner surface with two parts. It will become apparent from the shown exemplary embodiments following hereinbelow that corner surface 4 can also have only one part, this being straight or curved.

Tile surface 3 and at least a portion of corner surface 4 which is adjacent to tile surface 3 are each provided with an LED screen 5. In FIG. 1A the designated corner surface 4 and the designated tile surface 3 could be provided with an LED screen. These LED screens lie parallel at least at the position of their border, such that at the position of the border the LEDs have an intermediate distance which is roughly the same as the intermediate distance of LEDs lying centrally in the screen. A spectator is hereby given the impression that one large LED screen is formed, which extends over tile element 2a and corner element 1. In the embodiment of FIG. 1A the LED screen continues to the edge of the wall formed by tile element 2a and corner element 1.

Figure 1B:
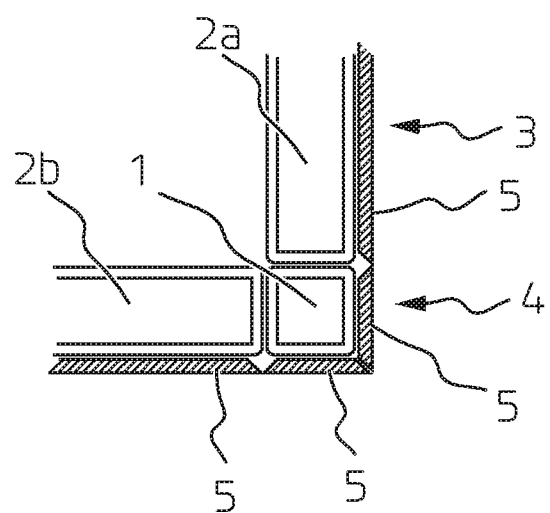
FIG. 1b shows a cross-section of a corner element with two tile elements on which LED screens are provided.

FIG. 1B shows a cross-section of a corner element 1 and two tile elements 2a and 2b which are placed at an angle relative to each other. In the embodiment of FIG. 1B the screen extends over the corner. More specifically, the two parts of corner surface 4 are both provided with a screen 5, and the tile surface 3 of both tile elements 2a and 2b is provided with an LED screen 5. Because the LED screen extending over corner surface 4 extends substantially parallel to the tile elements both at the position of the border with the first tile element 2a and at the position of the border with the second tile element 2b, it is relatively simple to have the LED screens fit together well. Fitting together well is understood to mean that the intermediate distance between LEDs of adjacent screens is substantially the same as the intermediate distance of the LEDs within one and the same screen. A high level of visual uniformity is hereby obtained. Corner element 1 can have a custom and/or unique design in order to have a screen which extends continuously over the whole corner surface 4.

The LED screens 5 which are provided on corner element 1 can be removable. Their removability enables a user to opt to integrate corner element 1 as connection of tile elements at 90 degrees or as connection of elements at 180 degrees, this being mutually in line. The skilled person will appreciate that when corner element 1 is used to connect elements at an angle of 180 degrees, only half of that which now forms corner surface 4 will be corner surface. When LED screens 5 are removable it also becomes possible to build the configuration of FIG. 1a, i.e. a screen which stops at the peripheral edge of a wall.

Figure 2:
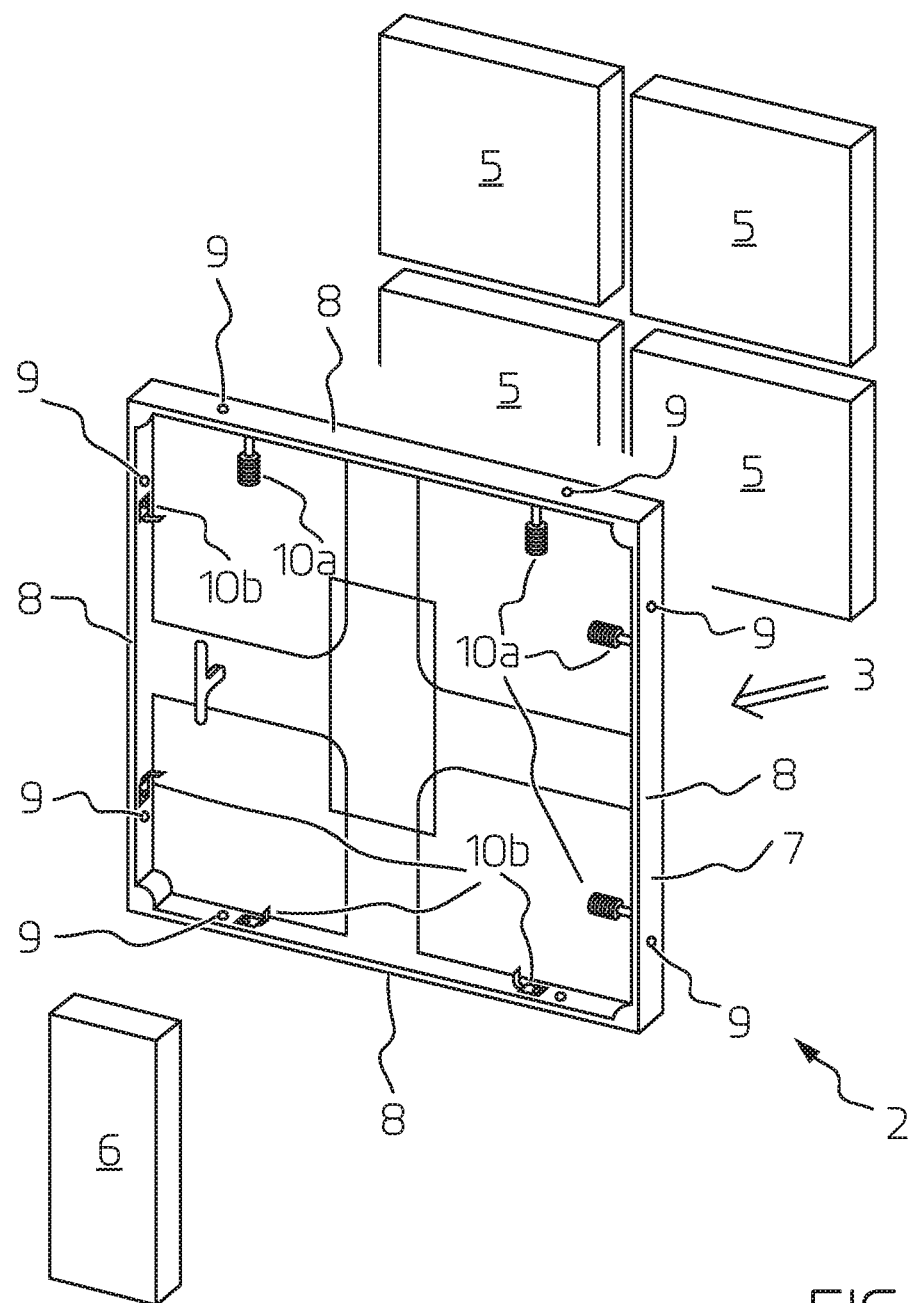
FIG. 2 shows an exploded view of a tile element with LED modules according to an embodiment.

FIG. 2 shows a detail of a tile element 2. Tile element 2 has a chassis 7. The chassis 7 forms a frame whereby the tile element 2 can be integrated in a greater whole. Chassis 7 also allows external elements to be coupled and integrated in tile element 2. In the embodiment of FIG. 2 a tile element 2 is thus shown in which four LED screens 5 can be placed. The LED screens 5 can be placed in chassis 7 in different angular orientations, typically rotated 90° relative to each other. The viewing direction of the LED screen is hereby adjusted. The viewing direction has been described above. By rotating LED screens 5 LED orientations of adjacent elements can be coordinated with each other and the viewing direction, and so the visual impression made by the screen, will be the same from one determined direction. This increases the visual uniformity of the LED screen which extends over a plurality of elements. Chassis 7 is further provided for mounting a control module 6. Control module 6 is operatively connected to the LED screens 5 and to an external controller (not shown) for the purpose of generating control signals to LED screens 5. Chassis 7 more preferably comprises at least one return hole (not shown) on the rear side for mounting a rear wall. Chassis 7 more preferably comprises at least one handle to facilitate handling of the chassis 7 during construction and dismantling of a modular construction. This handle is preferably provided on a rear side of chassis 7.

FIG. 2 shows a square tile element 2. This tile element has four connecting surfaces 8. Each connecting surface 8 can rest against an adjacent element of the modular construction. The connecting surface 8 can rest against an adjacent tile, corner element or profile or other modular element. In order to optimize connection with adjacent elements, connecting means are provided in each connecting surface 8. FIG. 2 shows an embodiment in which first connecting means 9 are provided as holes in which a screw or bolt (not shown) can be placed for the purpose of connecting two adjacent elements. These first connecting means are preferably used when there is little free space in adjacent elements. A screw or bolt can be provided highly compactly and takes up little space. A drawback of using a screw or bolt is that it is slightly more time-consuming to place and fasten the screw or bolt. Second connecting means 9 are therefore also provided in each connecting surface 8.

The second connecting means are rapid couplings. More specifically, the second connecting means are complementary components which can be operated without external tools in order to connect adjacent elements to each other. Provided in FIG. 2 is an embodiment wherein second connecting means comprise two complementary components 10A and 10B. Opposite connecting surfaces of tile element 2 have differing complimentary connecting means 10. In FIG. 2 the right-hand connecting surface 8 and the upper connecting surface 8 are provided with a pin. The pin can be provided with a handle and can be disposed in spring-loaded manner so that the pin can be moved manually and in relatively simple manner. The pin preferably extends substantially parallel to tile surface 3. The pin is connected to a connecting surface 8 and is preferably substantially perpendicular relative to this connecting surface 8. The pin is connected at a predetermined position of connecting surface 8. Provided in opposite connecting surface and directly opposite the predetermined position is an opening for receiving the pin. A displaceable locking element is preferably provided at the position of the opening. The displaceable locking element has a handle and a lock for locking the pin when it has been inserted into the opening.

In FIG. 2 the lower and left-hand connecting surfaces are provided with an opening with a locking mechanism for the purpose of locking the pin. This is designated in the figure with reference numeral 10B. The skilled person will appreciate that a pin with a narrowed portion can be locked by sliding a plate with a lock. Via the second connecting means 10A and 10B components from the modular construction can be connected to each other, wherein there is sufficient space for handling connecting means. The second connecting means allow an extremely rapid and simple assembly and disassembly. The skilled person will appreciate that other embodiments of first and/or of second connecting means can be provided in order to achieve the above described advantages and effects therewith.

The second connecting means 10A and 10B are provided at least in order to connect adjacent elements in line with each other. In this position the visible surfaces extend parallel. The second connecting means 10A and 10B are preferably at least partially rotatable in order to also connect adjacent elements to each other at a limited angle. A limited angle is defined as an angle of a maximum of 10 degrees, preferably a maximum of 15 degrees. This means that the visible sides of adjacent elements extend at the limited angle relative to each other. A wedge, which positions the elements at the limited angle relative to each other, is then preferably placed between adjacent elements. Magnets are preferably provided in the connecting side for the purpose of placing the wedge, so that the wedge can be positioned magnetically. This increases the convenience of use. Placing adjacent elements at an angle for instance enables a concave or hollow screen to be formed with straight elements.

At the position of the rear side chassis 7 is preferably provided with a cloth connecting provision (not shown). The cloth connecting provision preferably comprises a groove adjacently of the peripheral edge of chassis 7. The groove is preferably provided in order to clamp an edge of a cloth. The groove is preferably bounded by two edges extending upward from the rear side of chassis 7 so as to form an upper border of the rear side. The cloth can be clamped in the groove. For this purpose the cloth can be provided at the position of its edge with a thickened portion. Alternatively, the cloth can be clamped in the groove by pressing a mounting cord or rope into the groove and thus securing the cloth in the groove via the mounting cord or rope.

At the position of the rear side chassis 7 is preferably further provided with a plate connecting provision. The plate connecting provision is preferably formed by a substantially flat surface extending with a width of at least 5 millimetres over the periphery of the chassis so as to function as connecting surface for a plate. The substantially flat surface is preferably provided with a plate connecting strip which is glued onto the surface.

Figure 3A:
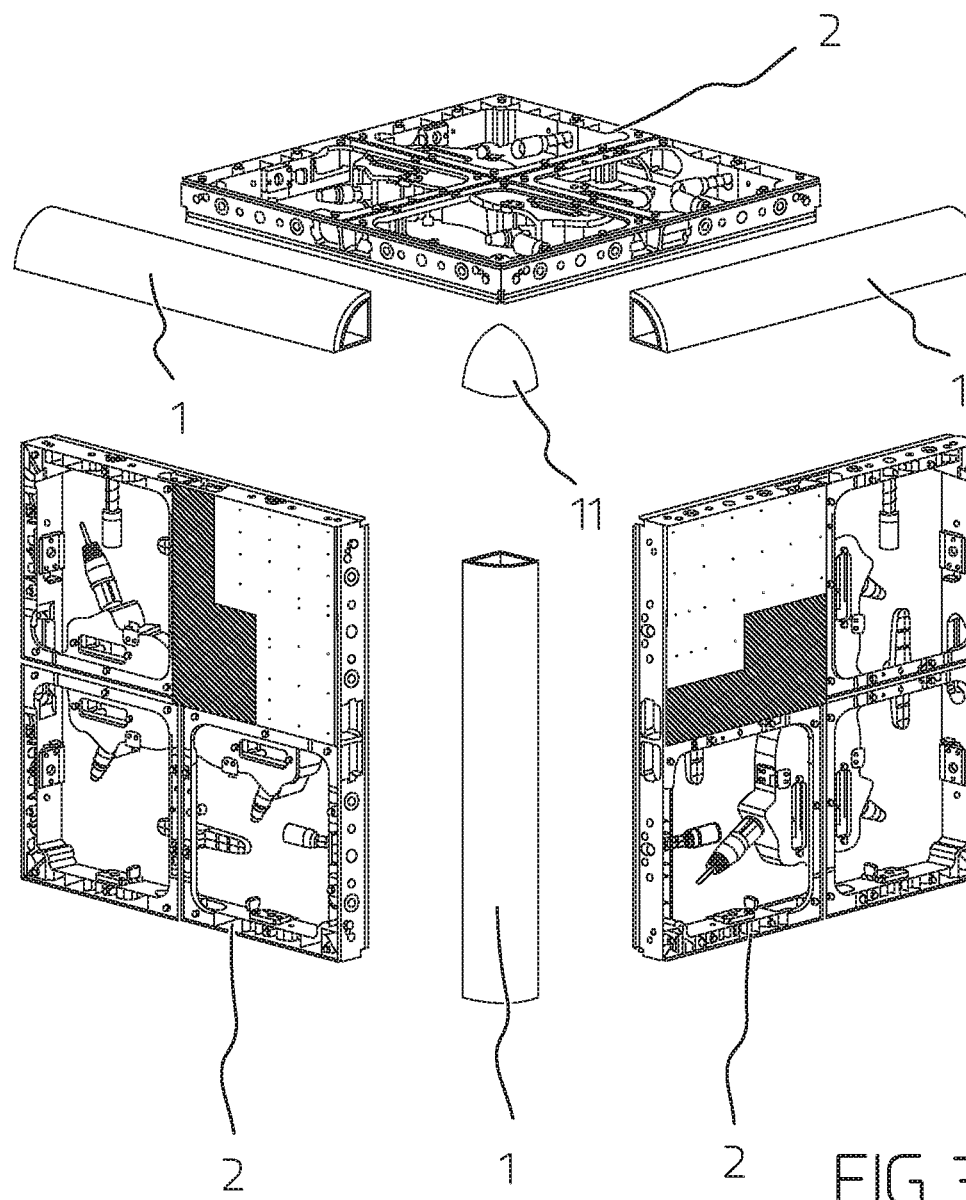
FIG. 3 shows several embodiments of modular constructions according to the invention.

FIG. 3A shows a first embodiment of a three-dimensional corner in a modular construction. When a screen extends over a three-dimensional corner, three tile elements 2 are provided, these each comprising an LED screen. The three tile elements 2 are connected to each other in a three-dimensional corner via intermediate corner elements 1. In the embodiment of FIG. 3A the corner elements 1 have a curved corner surface. The curved corner surface 4 is curved through an angle of about 90°. The edge of the corner surface 4 lying against the one tile element 2 will hereby be substantially parallel to the surface of tile element 2 at the position of the border. At the other border with the other tile element the corner surface 4 will also lie substantially parallel at the position of the border with the tiles surface of this tile element 2. A smooth transition of the screen can thus be provided at the position of the two tile elements, such that a uniform impression is created. Further provided in FIG. 3A is a cube element 11. The cube element 11 of FIG. 3 is rounded at its corners so as to follow the curve of corner elements 1. Because cube element 11 still has three connecting surfaces, it is however still deemed a cube element 11.

Figure 3B:
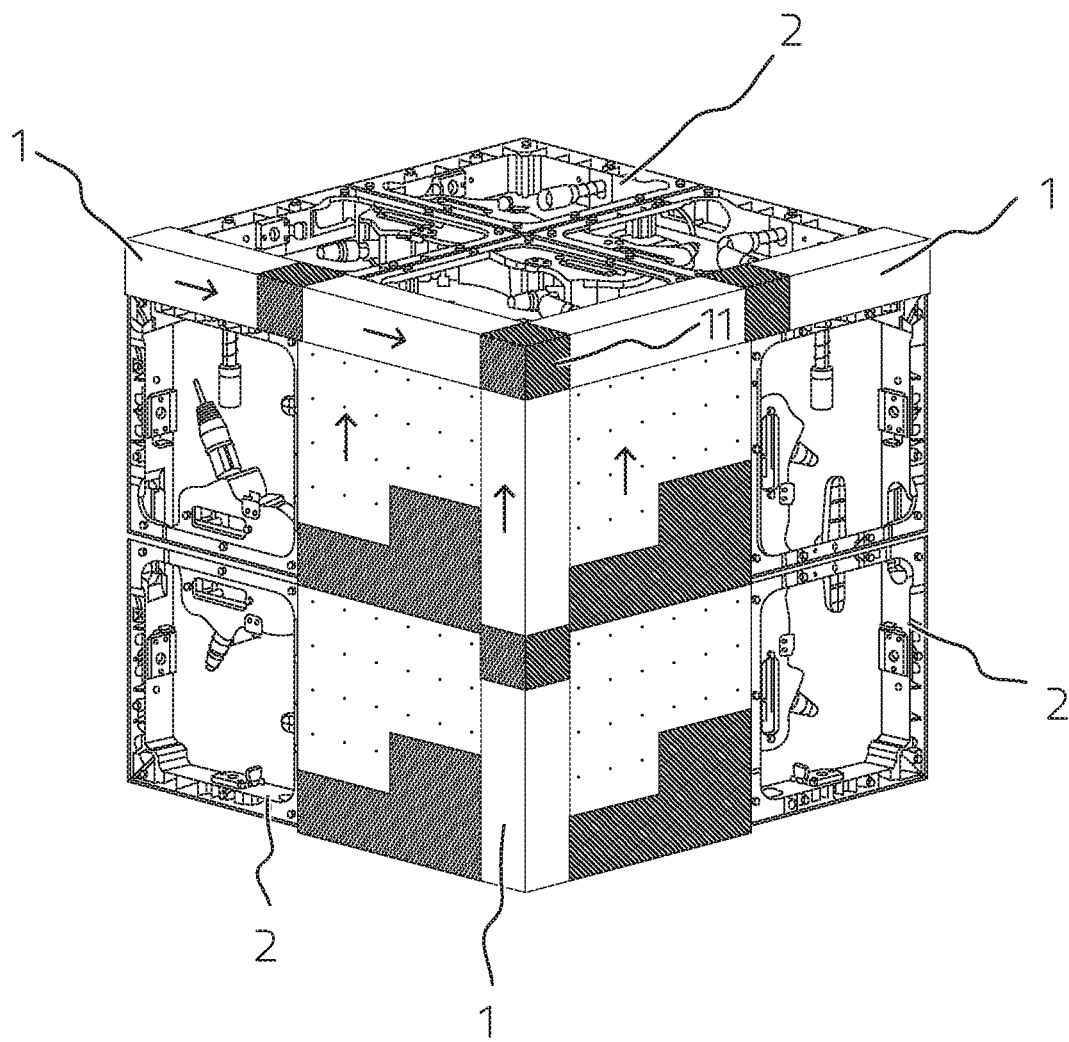

FIG. 3B shows an alternative embodiment in which the corner elements 1 and cube element 11 are not rounded, but have straight corners. Cube element 11 has six substantially square surfaces, three surfaces of which form the visible side and three surfaces of which form connecting surfaces to corner elements. The corner elements have two elongate visible surfaces, in each case lying adjacently of a tile surface and substantially in the same plane therewith. The skilled person will appreciate that on the basis of the above described principles an LED screen can extend over the three-dimensional corner.

Figure 3C:
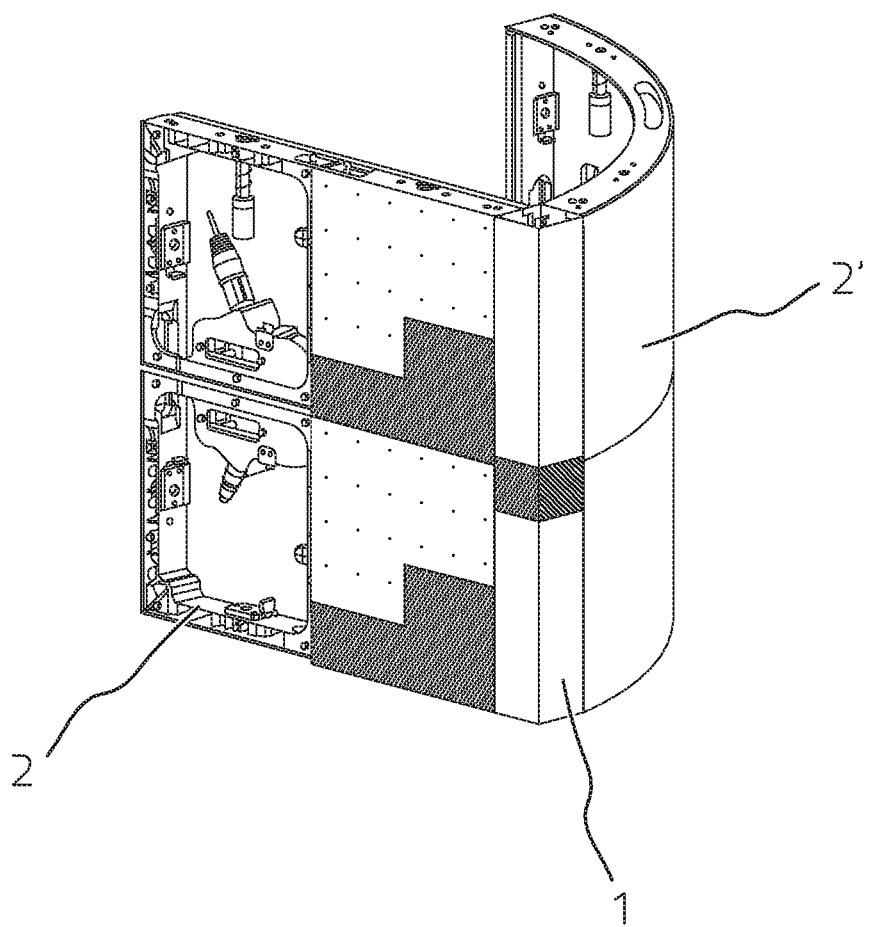

FIG. 3C shows a further alternative embodiment wherein a curved tile element 2' is provided. Curved tile elements with LED screens are known and can be convex or concave. They can be connected via a corner element 1 to a further tile element 2 in simple manner. For the curved LED tile 2' it is also the case that at the position of the border with corner element 1 the tile surface lies substantially parallel and in line with the corner surface. LED screens can hereby be closely connected.

Figure 4:
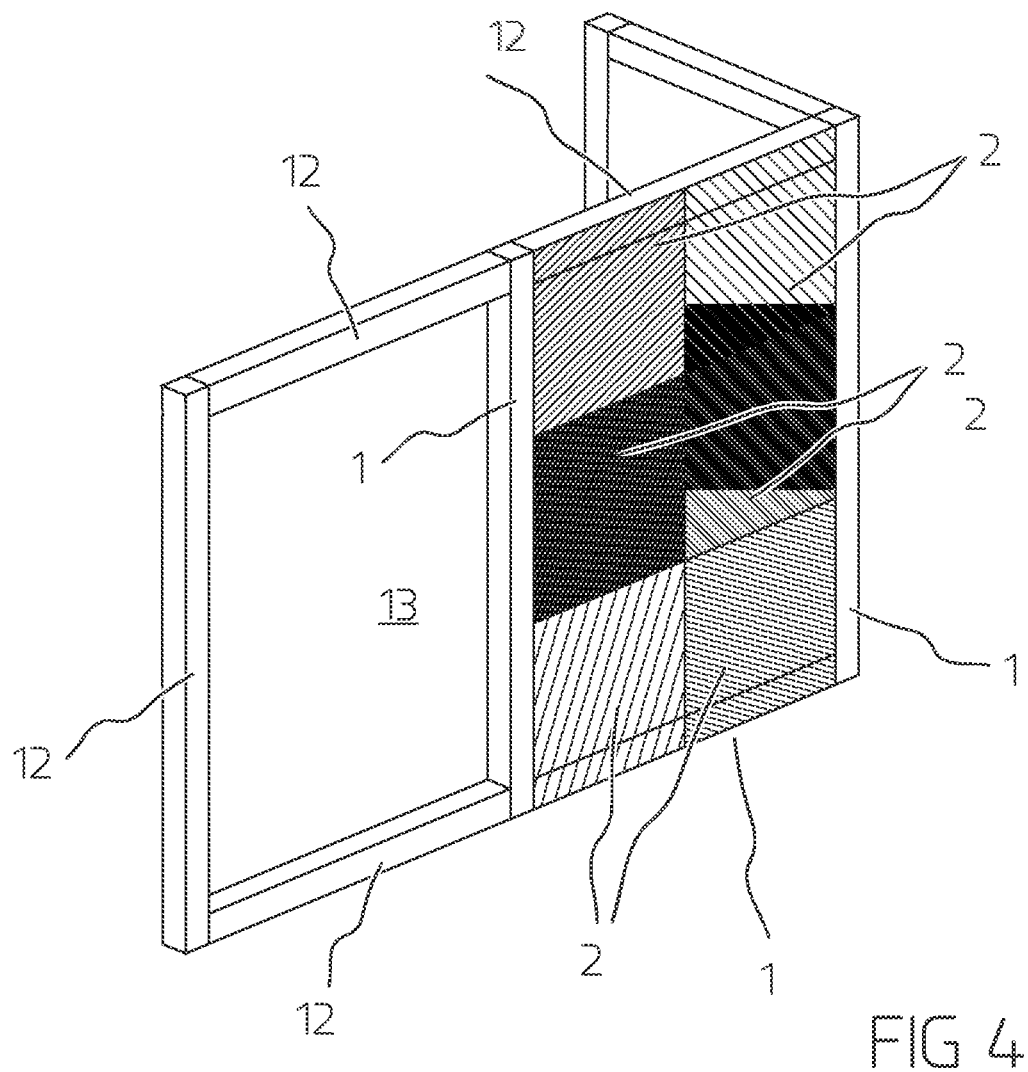
FIG. 4 shows a modular construction in which the invention can be applied.

FIG. 4 shows the example of a modular construction wherein a plurality of profiles 12 is used to form the periphery of a wall 13. The wall can for instance be formed by tensioning a cloth or placing a panel in profiles 12. The profiles function as corner element 1. Constructed adjacently of wall 13 is a further wall with six tile elements 2. Tile elements 2 can be provided with an LED screen. Alternatively, tile elements in a modular construction can comprise fixed panels, cloths, light boxes or other elements. Tiles can also comprise functional or aesthetic elements, for instance socket outlets, hooks or other fastening elements for suspending goods from a wall, lighting elements and so on. Tile elements 2 are typically also held in a frame constructed with profiles 12 and/or corner elements 1. Profiles 12 and corner elements 1 typically have a similar construction and in some cases are even interchangeable. Because the construction elements, these being the corner elements 1, profiles 12 and tiles 2 of a traditional modular construction, are interchangeable with tile elements and corner elements of the invention, which are provided with an LED screen, an LED screen can be integrated freely in a modular construction as shown in FIG. 4. The same known components can be used together with the new components which are covered with LED screens for the purpose of integrating an LED screen in a modular construction, wherein the LED screen can even extend over a corner of the construction. It is noted here that a corner element 1 can also have only one visible elongate side which is provided with an LED screen. With such a corner element with only one elongate side which is provided with an LED screen a plurality of LED tiles can be connected to each other in line with each other, at an angle of 180 degrees, via a corner element.

The skilled person will appreciate on the basis of the above description that the invention can be embodied in different ways and on the basis of different principles. The invention is not limited to the above described embodiments. The above described embodiments and the figures are purely illustrative and serve only to increase understanding of the invention. The invention will not therefore be limited to the embodiments described herein, but is defined in the claims.

The invention claimed is:

1. Set comprising:
   at least one corner element and at least one tile element, connectable to each other so as to construct a modular construction, wherein at least one tile element is provided with an LED screen which extends over substantially a whole tile surface, wherein the tile surface forms a visible side of the tile element in the modular construction, and wherein at least one corner element is provided with an LED screen which extends over a corner surface which, in connected state, is adjacent to said tile surface, and
   a cube element having three primary visible sides, wherein the cube element is provided with an LED screen extending over a cube surface, such that in connected state the LED screen of the cube surface is adjacent to the LED screen of the at least one corner element,
   wherein the at least one tile element has one primary visible side and wherein the at least one corner element has two primary visible sides.

2. Set according to claim 1, wherein in connected state the tile surface and the corner surface extend substantially parallel, at least at the position of their border.

3. Set according to claim 1, wherein each LED screen has an LED orientation and wherein the LED orientation of the tile element is the same as the LED orientation of the corner element.

4. Set according to claim 1, wherein each tile element has a chassis in which at least one LED module is placed so as to form the LED screen.

5. Set according to claim 4, wherein the LED module can be connected in a plurality of angular positions to the chassis in order to align the LED orientation of the tile element with the LED orientation of the corner element.

6. Set according to claim 5, wherein the connecting means comprise first connecting means for connecting a tile element to a corner element and comprise second connecting means for connecting a tile element to a tile element.

7. Set according to claim 4, wherein the chassis has a plurality of connecting surfaces at the position of the edges of the tile surface so as to be integrated in the modular construction.

8. Set according to claim 7, wherein each connecting surface has connecting means which are complementary to connecting means on an adjacent tile element and on an adjacent corner element, such that each connecting surface can be connected to a corresponding connecting surface of an adjoining tile element or corner element.

9. Set according to claim 1, wherein each tile element and each corner element further has a control module for controlling their LED screen.

10. Set according to claim 9, wherein the different control modules of the elements are coupled in the modular construction to a central processor which provides each control module with individual control signals in order to reproduce a predetermined visual representation over the multiple individual LED screens in the modular construction.

11. Set according to claim 1, wherein the LED screen of the at least one corner element extends over the two primary visible sides.

12. Set according to claim 1, wherein each tile element and each corner element further has a control module for controlling their LED screen and wherein the LED screen of the cube surface is operatively connected to the control module of the at least one corner element.

* * * * *

UNITED STATES PATENT AND TRADEMARK OFFICE
CERTIFICATE OF CORRECTION

| | | |
|---|---|---|
| PATENT NO. | : 12,058,821 B2 | Page 1 of 1 |
| APPLICATION NO. | : 17/641314 | |
| DATED | : August 6, 2024 | |
| INVENTOR(S) | : Dirk Deleu | |

It is certified that error appears in the above-identified patent and that said Letters Patent is hereby corrected as shown below:

On the Title Page

Item (71), the address of the Applicant should be listed as:
-- Aluvision N.V., Kortrijk (BE) --

Signed and Sealed this
Twenty-seventh Day of August, 2024

Katherine Kelly Vidal
*Director of the United States Patent and Trademark Office*